United States Patent
Ehmke et al.

(10) Patent No.: US 10,750,645 B2
(45) Date of Patent: Aug. 18, 2020

(54) TRANSPARENT DISPLAY PANEL COOLING

(71) Applicant: Texas Instruments Incorporated, Dallas, TX (US)

(72) Inventors: John Charles Ehmke, Garland, TX (US); Scott Patrick Overmann, Parker, TX (US); Sean Christopher O'Brien, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/218,468

(22) Filed: Dec. 12, 2018

(65) Prior Publication Data
US 2020/0196481 A1 Jun. 18, 2020

(51) Int. Cl.
G02F 1/1333 (2006.01)
G02B 27/01 (2006.01)
H05K 7/20 (2006.01)
B60K 35/00 (2006.01)

(52) U.S. Cl.
CPC ........... *H05K 7/2099* (2013.01); *B60K 35/00* (2013.01); *G02B 27/0101* (2013.01); *G02F 1/133385* (2013.01); *H05K 7/20972* (2013.01); *B60K 2370/334* (2019.05)

(58) Field of Classification Search
CPC .............................. G03B 21/16; H04N 9/3144
See application file for complete search history.

(56) References Cited

U.S. PATENT DOCUMENTS

| | | | | |
|---|---|---|---|---|
| 5,282,121 A * | 1/1994 | Bornhorst | F21S 10/007 | 362/294 |
| 5,432,526 A * | 7/1995 | Hyatt | B60R 16/0373 | 345/87 |
| 5,758,956 A * | 6/1998 | Bornhorst | F21S 10/007 | 362/294 |
| 6,416,183 B1 * | 7/2002 | Colpaert | G02B 7/005 | 353/101 |
| 6,991,335 B2 * | 1/2006 | Kondo | G03B 21/16 | 348/E5.141 |
| 2002/0015305 A1 * | 2/2002 | Bornhorst | F21S 10/007 | 362/293 |
| 2004/0257538 A1 * | 12/2004 | Kondo | G03B 21/16 | 353/54 |
| 2011/0058167 A1 * | 3/2011 | Knox | G01N 15/06 | 356/338 |
| 2013/0050658 A1 * | 2/2013 | Morohoshi | G03B 21/145 | 353/57 |

* cited by examiner

*Primary Examiner* — Paulos M Natnael
(74) *Attorney, Agent, or Firm* — Michael A. Davis, Jr.; Charles A. Brill; Frank D. Cimino (57) ABSTRACT

In described examples, an image-generating panel is arranged for modulating a projection beam to include a modulated optical image. A cooling device is arranged to transfer heat received from the image-generating panel to a heat sink. The cooling device is arranged to receive the projection beam on a first side and to transmit the projection beam from a second side. The heat received from the image-generating panel can include heat generated by the image-generating panel in response to incidental sunlight.

11 Claims, 5 Drawing Sheets

TRANSPARENT DISPLAY PANEL COOLING

BACKGROUND

In some display system applications, various displays are subject to environmental conditions that can damage or otherwise impair proper operation of such displays. The display technology can include relatively large TFT (thin-film transistor) LCD (liquid crystal display) panels for projecting images in automotive HUD (heads-up display) systems. However, the TFT LCD display panels are sensitive to heating encountered in some environments in which automobiles are used.

SUMMARY

In described examples, an image-generating panel is arranged for modulating a projection beam to include a modulated optical image. A cooling device is arranged to transfer heat received from the image-generating panel to a heat sink. The cooling device is arranged to receive the projection beam on a first side and to transmit the projection beam from a second side. The heat received from the image-generating panel can include heat generated by the image-generating panel in response to incidental sunlight.

DETAILED DESCRIPTION

In the drawings, like reference numerals refer to like elements, and the various features are not necessarily drawn to scale.

In at least some automotive navigation and driving systems, TFT- (thin-film transistor-) based LCD (liquid crystal display) panels generate an image for projection on a HUD (heads-up display). For example, a HUD image (which can contain navigation information) can be projected on a front windshield of a vehicle (e.g., car). The HUD image can be viewed by an operator (e.g., driver) of the vehicle as being superimposed over a portion of the natural forward view that is afforded by the windshield. (The term "portion" can include an entire portion or a portion that is less than the entire portion.) The display of the HUD image on the windshield enhances safety because, for example, the operator can perceive pertinent information for enhancing situational awareness without otherwise being required to redirect the operator's gaze from the area in front of a vehicle being driven.

The HUD LCD panels include sensitive elements, which can be damaged and/or degraded by environmental factors. For example, the arrangement of a HUD LCD panel for projection of an image on a vehicle windshield can lead to a potentially damaging alignment between the sun and the HUD LCD panel. For example, incidental sunlight (e.g., direct sunlight and/or other forms of optical energy) can traverse the windshield and engage (e.g., irradiate) optical elements of the HUD system. The HUD optical elements (e.g., HUD optics) can include lenses, mirrors, transparent windows, reflective surfaces, apertures, covers and combinations thereof. The optical elements can focus (e.g., concentrate) or otherwise transmit incidental sunlight (or other radiation) upon the liquid crystals of the HUD LCD panel.

The liquid crystals are turned on (e.g., made transparent) to project light, and are turned off (e.g., made opaque) to block projection of light to the HUD image. The opaque (e.g., black) liquid crystals in the TFT-based LCD display panel of a HUD system readily absorb energy from incident light. Many (if not the vast majority) of the liquid crystals in a HUD system being used in operation are opaque, for example, so the projected information is limited and does not visually distract (or otherwise substantially obscure) the natural view of the operator across the windshield. In an example HUD navigation image, the pixels selected (e.g., modulated to be in an on state) for displaying navigational information can be sparsely located along the margins of the displayed image, whereas the unselected pixels are in the off state (e.g., so the natural forward view of the operator is not "whited-out" by a superimposed projected image). Accordingly, a substantially high percentage of pixels can be in the off state, whether the HUD is in-use or powered down.

The LCD liquid crystals (e.g., TFT-based liquid crystals) in the off state are nontransparent, so the off-state pixel areas of the TFT-based LCD HUD readily absorb large portions of incident radiation (e.g., sunlight). In contrast, on-state pixel areas of the TFT-based LCD HUD are transparent, so that large portions of the incident radiation are transmitted without absorption through the transparent liquid crystals. When the vast majority of LCD pixels are in the off state, the LCD panel absorbs the vast majority of the incoming solar energy. The heat generated by incident sunlight (including sunlight energy intensified or otherwise concentrated by HUD optics) can damage or otherwise impair proper operation of LCD-based HUD optics and image-generating elements.

As described hereinbelow, LCD-based HUDs can include at least one example convection-assisted transparent cooling system.

In a first such example of a convection-assisted transparent cooling system, a cooling chamber is arranged adjacent to an LCD-based HUD display panel. The display panel is oriented to be at least partly vertical (e.g., parallel to local gravitational forces). The cooling chamber includes a cavity in which a fluid (e.g., a liquid coolant) circulates (e.g., convects) for transferring heat from the LCD-based HUD display panel to a heat sink. The fluid becomes more buoyant in response to heat generated by the display panel and rises. The fluid rises to an upward portion of the cavity, which is adjacent to a heat sink. The heat sink receives (e.g., absorbs) heat from (e.g., transferred from) the fluid, so the fluid is cooled and becomes less buoyant. The cooled fluid sinks to a lower portion of the cavity where it is available for further absorbing heat from the display panel (e.g., which establishes a coolant loop). The convection of the fluid cools the LCD-based HUD display panel without, for example, requiring power to generate the cooling current(s).

In a second such example of a convection-assisted transparent cooling system, a phase-change convection system includes a cooling chamber arranged adjacent to an LCD-based HUD display panel. The display panel can be oriented to be at least partly vertical (e.g., non-orthogonal to local gravitational forces). The cooling chamber includes a cavity in which the cavity interior surfaces are roughened or grooved (e.g., for promoting movement of liquids via capillary action). A coolant (e.g., a phase-change coolant) is included in the cavity for transferring heat from the LCD-based HUD display panel to a heat sink. The coolant can change from a liquid-phase state to a gas-phase state in response to heat generated by the display panel. The gas-phase coolant diffuses (from areas of greater concentrations to lesser concentrations), so that a portion of the gas-phase coolant diffuses to an distal portion of the cavity, where the distal portion of the cavity is adjacent to a heat sink. The heat sink absorbs heat from the gas-phase coolant, and in response, the gas-phase coolant is cooled and condenses into a condensate (e.g., changes from a gas-phase state to a liquid-phase state). The condensate flows (e.g., via capillary action) to a lower portion of the cavity and is available to further absorb more heat from the display panel (e.g., which establishes a coolant cycle). The condensate flow can occur (e.g., because of capillary action forces resulting) independently of the orientation of the cooling chamber. The condensate flow of the phase-change cooling system can be assisted by gravity (e.g., made more efficient) when the condenser is arranged to be higher in elevation than the evaporator. The convection of the coolant cools the LCD-based HUD display panel without, for example, requiring power to generate the cooling current(s).

In a third such example of a convection-assisted transparent cooling system, a cooling chamber is arranged adjacent to an LCD-based HUD display panel. The display panel can be optionally oriented to be at least partly vertical (e.g., non-orthogonal to apparent gravitational forces). The cooling chamber includes a cavity in which transparent windows form channels for a forced and/or convecting airflow to flow over surfaces adjacent to the display panel. The cooling airflow can be forced air, which is channeled through a first channel (e.g., a heated airflow) to transfer heat from the LCD-based HUD display panel to a heat sink. The heat sink absorbs heat from the forced air, and the cooled airflow can return via a second channel (e.g., a return channel). A blower (e.g., fan) can use active power to force (e.g., accelerate) the flow of air through the first and second channels. Buoyant convection currents of the air can flow through the first and second channels when power is not applied to the blowers, which can provide at least some cooling even when power is not applied to the blowers. The closed-loop circulation of the cooling airflow helps prevent the intrusion of dust and dirt into areas that are close to the display panel. For example, dust and dirt introduced into areas that are close to the display panel are near the focal point of the display panel, and can be discernable (e.g., as shadows or in silhouette) by a viewer of the projected HUD image.

In yet another example, an LCD-based HUD includes a conduction-assisted transparent cooling system. In the example conduction-assisted cooling system, a transparent (e.g., having an internal transparency of greater than 95 percent for a 1 mm thickness throughout the spectral range of 420 through 680 nm), thermally conductive (e.g., at rates greater than around 25 Watts per meter Kelvin) cooling panel is arranged adjacent to an LCD-based HUD display panel in any suitable orientation. The cooling panel can include transparent, thermally conductive materials such as silicon carbide, gallium nitride, sapphire and/or diamond. Each of the thermally conductive materials can be arranged in a transparent form (e.g., crystalline form) for transmitting a projection beam from a first side of the cooling panel to a second side opposite the first side. The cooling panel cools the LCD-based HUD display panel by transferring heat (e.g., via thermal conduction) to a heat sink for dissipation of heat to the environment.

Such arrangements facilitate a compact arrangement of components in a HUD system that are protected against damage from heat generated by incident solar radiation. The compact arrangement can be used to increase reliability and reduce costs, complexity and space requirements of a HUD assembly.

Figure 1:
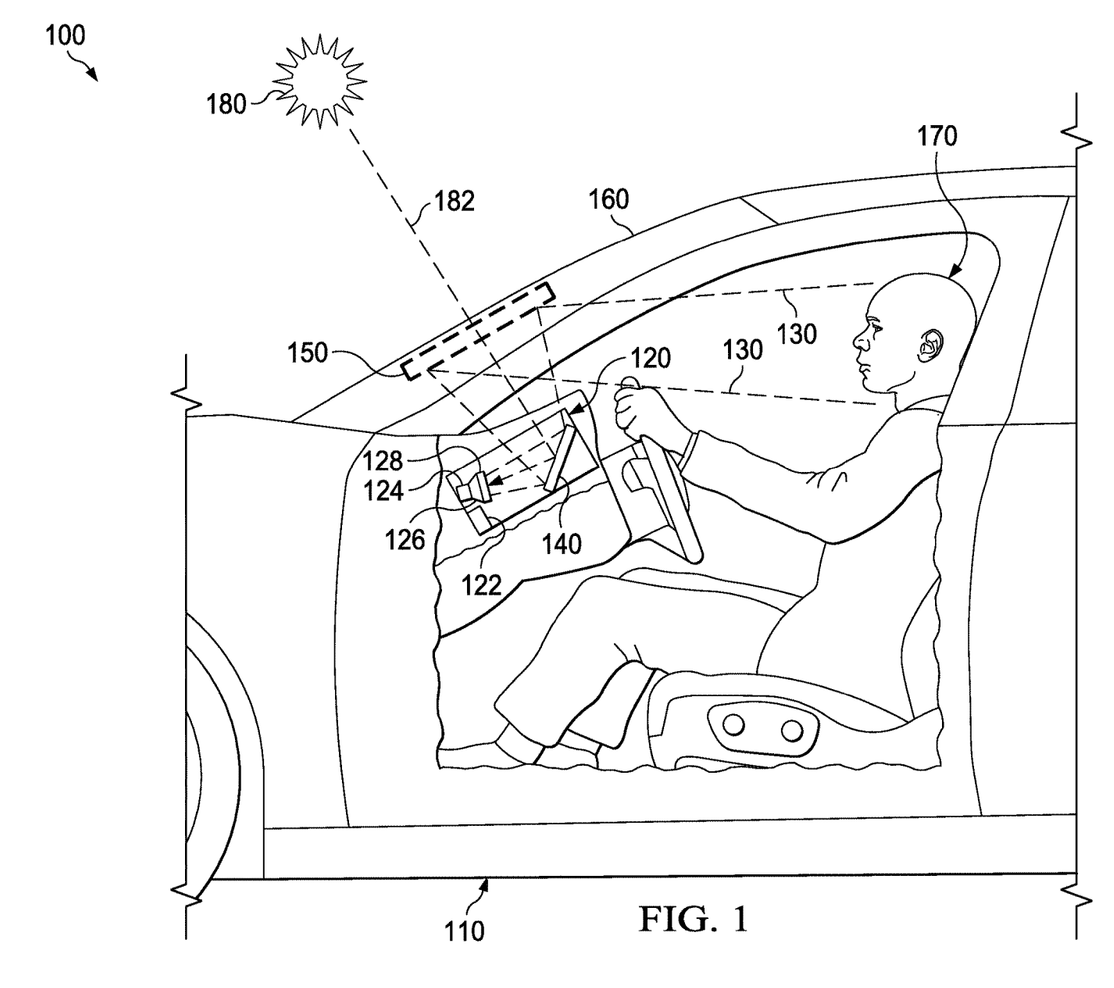
FIG. 1 is a side view of an example heads-up display (HUD) assembly in an automotive application.

FIG. 1 is a side view of an example transparently cooled heads-up display (HUD) system in an automotive application. Other kinds of piloted and/or operated vehicles or systems can include the HUD assembly 120. The HUD system 100 generally includes an automobile 110, a HUD assembly 120 and a windshield 160. The windshield 160 provides a semi-reflective surface upon which a HUD image 150 is projected via a focused beam of light 130. However, incidental light 182 (from the sun 180, for example) can traverse the windshield 160, enter optic 126, and damage internal components of the HUD assembly 120.

The HUD assembly 120 can be generally arranged in a dashboard area of a vehicle, so a vehicle operator 170 can view the projected image 150 on the windshield 160. The HUD assembly 120 includes a processor 122, a light source 124, optics 126, a transparently cooled image-generating (e.g., display) panel 128, and a reflecting mirror 140.

The processor 122 can be coupled to a navigational unit, engine computers, dashboard display controllers, sensors and other electronic devices to receive information for displaying to the operator 170. The processor 122 can process the received information to generate video frames, which can include indicators for displaying the received information. The video frames can be imaged by selectively actuating TFT-based LCD elements of the transparently cooled image-generating panel 128 in response to the video frames, and by directing a projection beam (e.g., of light 130) through the transparently cooled image-generating panel 128 for projection on the windshield 160.

The light source 124 can be one or more controllable lamps such as incandescent light bulbs, mercury, halogen or xenon lamps, light-emitting diode (LED) arrays and/or laser diodes (e.g., for exciting a phosphor surface for emission of light of a selected frequency). The light-emitting elements of the light source 124 can be formed in the same or in separate substrates. The light-emitting elements of the light source 124 can be individually or collectively controlled. The light-emitting elements of the light source 124 can be the same color or different colors, wherein a broad range of colors can be generated using additive color synthesis. While three colors (e.g., red, blue and green colors) can be used in some examples, other numbers of colors can be used to generate colors of a selected color gamut in other examples.

The light source 124 is arranged to produce light for directional focusing by optics (e.g., one or more lenses) 126. The optics 126 can include a concave surface for refracting incident light from a light source 124 into generally parallel (e.g., collimated) light rays of light 130 directed: (a) toward the transparently cooled image-generating panel 128; (b) toward the mirror 140; (c) toward the windshield 150 as a reversed image; and (d) toward the operator 170 as a non-reversed image. The optics 126 can be arranged:

between the light source and the transparently cooled image-generating panel 128; between the transparently cooled image-generating panel 128 and the windshield 160; and/or in any convenient location downstream of the light source 124.

The transparently cooled image-generating panel 128 is arranged to: receive a projection beam from the light source 124 on a first side of the image-generating panel 128; modulate the projection beam to include a modulated optical image in response to an electronic image; and to transmit the modulated projection beam from a second side of the image-generating panel 128 that is opposite the first side. The modulated projection beam can include an optical image that is visible when reflected from a viewing surface. The first and second sides of the image-generating panel 230 are transparent, so that light is transmitted efficiently through the image-generating panel 230.

The image-generating panel 128 is arranged to receive focused light from the light source 124 such that each of the image-generating elements (e.g., liquid crystals, not shown) of the image-generating panel 230 is illuminated. The image-generating elements can be arranged as a bi-dimensional array of selectively opaque or transparent elements, in which the array of image-generating elements can be arranged in rows and columns. Each such image-generating element can be controlled (e.g., actuated) in response to a respective portion (e.g., pixel) of an electronic image (e.g., video frame) for display. For example, thin-film transistors are arranged to individually control a respective liquid crystal of an LCD array in response to an electronic image; each such image-generating element can block or transmit a selected portion of the focused light beam, so that the electronic image can be projected as a modulated optical image.

The image-generating panel 128 can receive heat from the light source 124, but can also receive heat from the sun 180 when the HUD assembly 120 is in solar alignment. Such solar heat can damage the relatively delicate TFT-based LCD elements of the image-generating panel 128 that are illuminated by incidental light 182 from the sun 180.

The image-generating panel 128 is generally oriented vertically, so that cooling convection currents of an at least partially transparent cooling chamber (described hereinbelow) of the image-generating panel 128 can be circulated by forces of buoyancy. The cooling convection currents can be currents of a coolant such as liquids, phase-change coolants or gasses (e.g., air) in a cooling chamber of the image-generating panel 128. The cooling convection currents can transfer heat received by the relatively delicate TFT-based LCD elements to a heat sink (described hereinbelow). The transferred heat reduces the temperature of the sunlight-illuminated portions (and portions adjacent to the sunlight-illuminated portions) of the TFT-based LCD elements, which helps protect the TFT-based LCD elements from damage resulting from overheating.

The mirror 140 can be a complex geometric shape. For example, the mirror can include a reflective surface, such as an exterior or interior conic or biconic surface. An interior reflective surface can be folded inward (e.g., so that incident light is reflected as convergent rays of light 130), whereas an exterior reflective surface can be folded outward (e.g., so that incident light is reflected as divergent rays of light 130). The mirror is arranged to focus a projected image on the windshield 160 (which can also be curved), so the projected image is focused for clear viewing by the operator 170.

Examples of the transparently cooled HUD assembly 120 are described hereinbelow. For example: an example liquid-cooled HUD assembly 120 is described with reference to a front-view (of FIG. 2A) and a side-view (of FIG. 2B); an example phase-change fluid-cooled HUD assembly 120 is described with reference to a front-view (of FIG. 3A) and a side-view (of FIG. 3B); an example air-cooled HUD assembly 120 is described with reference to a side-view (of FIG. 4); and an example solid-panel-cooled HUD assembly 120 is described with reference to a front-view (of FIG. 5A) and a side-view (of FIG. 5B).

Figure 2A:
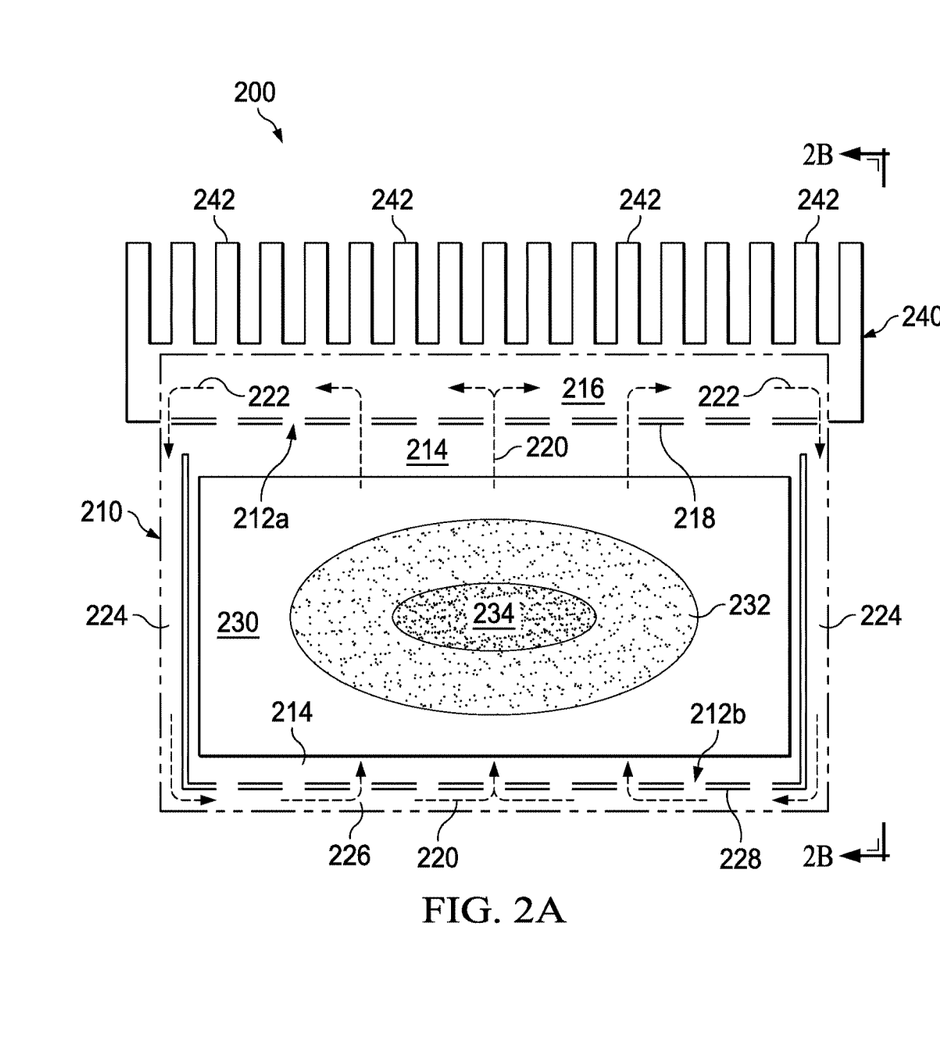
FIG. 2A is a front view of an example liquid-cooled HUD assembly.

FIG. 2A is a front view of an example liquid-cooled HUD assembly. The transparently cooled image-generating panel assembly 200 is an image-generating panel assembly such as the transparently cooled image-generating panel 128. The image-generating panel assembly 200 is cooled by a liquid coolant (e.g., such as propylene glycol). The liquid coolant is transparent so that, for example, a projection beam (e.g., a projection beam with or without a modulated optical image) can pass through (e.g., be transmitted through) the liquid coolant.

The transparently cooled image-generating panel assembly 200 generally includes a cooling chamber 210, an image-generating panel 230 and a heat sink 240. As shown in FIG. 1, incident sunlight 182 can enter the optics of the HUD assembly 120 when the optical path of the HUD assembly 120 is in solar alignment with the sun 180. In FIG. 2, the incident sunlight 182 induces localized heating (e.g., in sunlit region 234), which can damage the directly illuminated image-generating elements of the image-generating panel 230. Moreover, the heat absorbed by the indirectly sunlight-heated region 234 can dissipate in a laterally outward direction in the image-generating panel 230, so adjacent areas (e.g., indirectly sunlit heated region 232) in the image-generating panel 230 are indirectly heated in response to the incident sunlight. The indirectly heated image-generating elements of the image-generating panel 230 can also be damaged by the solar-induced heat.

In example simulations of an open-air convection thermal model of a vertically oriented TFT-based image-generating panel (e.g., without cooling provided by a cooling chamber), the model generated localized gains in temperature of over 100 degrees Celsius over ambient temperatures in response to direct solar heating. In a first simulation, an absorbed thermal load of 8 Watts induced local temperatures of 203 degrees Celsius for a panel of a 7-meter virtual image distance (VID) in ambient temperatures of 85 degrees Celsius. The virtual image distance is the distance of the virtual image that a driver would perceive with respect to the driver's eyes and/or from a windshield in front of the driver. (For example, when virtual image distance is greater than the distance of a driver's eyes to a windshield, the HUD image has an appearance to the driver as if the HUD image is "floating" out in space beyond the windshield.)

In a second simulation, an absorbed thermal load of 8 Watts induced local temperatures of 236 degrees Celsius for a panel of 15-meter VID in ambient temperatures of 85 degrees Celsius. In a third simulation, an absorbed thermal load of 8 Watts induced local temperatures of 162 degrees Celsius for a panel of 7-meter VID in ambient temperatures of 25 degrees Celsius. In a fourth simulation, an absorbed thermal load of 8 Watts induced local temperatures of 236 degrees Celsius for a panel of 15-meter VID in ambient temperatures of 197 degrees Celsius.

TFT-based image-generating panels can be damaged while being operated at temperatures greater than around 95 degrees Celsius. Likewise, TFT-based image-generating panels can be damaged while being stored at temperatures greater than around 105 degrees Celsius. The example simulations indicate the TFT-based image-generating panels can be damaged by incident sunlight in certain conditions because the induced heating of the TFT-based image-generating panels raises localized temperatures of the TFT-based image-generating panels above safe operating and storage limits.

The transparently cooled image-generating panel assembly 200 is generally oriented vertically (e.g., less than around 45 degrees from vertical), so that convection of a coolant in the cooling chamber 230 is induced. The image-generating panel 230 is thermally coupled to the cooling chamber 210. The cooling chamber 210 is a fluid-filled cavity for promoting, for example, the transfer of heat from the image-generating panel 230 to the cooling chamber 210. The image-generating panel 230 (which can be a TFT-based LCD panel) can be thermally coupled to the cooling chamber 210 by affixing the image-generating panel 230 to a transparent portion (e.g., surface) of the cooling chamber 210 by interposing a high-temperature transparent adhesive therebetween.

The image-generating panel 230 includes a programmable light modulator (electronic display) such as an TFT-based LCD panel. An optically active portion (e.g., for modulating pixels of a displayed image) of the image-generating panel 230 is affixed to a transparent (e.g., transparent in front view) surface of the cooling chamber 210. The cooling chamber 210 includes a cavity 214, which is adjacent to the optically active portion of the image-generating panel 230 (see, FIG. 2B). The central portion of cavity 214 is free from opaque internal structures that might otherwise noticeably block the passage of light or otherwise obscure the projection beam. The transparent surface of the cooling chamber 210 includes a heat-receiving portion arranged adjacent to (e.g., thermally coupled to) the optically active portion of the image-generating panel. Heat generated (e.g., by absorbing light) in the image-generating panel 230 is transferred to the transparent surface of the cooling chamber 210, and the heat transferred to the transparent surface of the cooling chamber 210 increases the temperature of a portion of a liquid coolant filling the cavity 214.

The heated portion of the liquid coolant becomes more buoyant with respect to unheated portions of the liquid coolant, so the heated portion is urged (e.g., forced) to ascend, which generates ascending convection currents 220. (The ascending convection currents 220 are generated, for example, in response to the heat transferred to the liquid coolant.) The ascending convection currents 220 traverse openings 212a in a lower wall 218 of an upper manifold 216, which transfers heat carried by the ascending convection currents 220 to sidewalls (shown in FIG. 2B) of the upper manifold 216. The sidewalls of the upper manifold 216 thermally couple heat from the sidewalls of the upper manifold 216 to the heat sink 240. (Both the heat sink 240 and the upper manifold 216 can be nontransparent because, for example, the heat sink 240 and the upper manifold 216 are not arranged in an optical path of the projection beam.)

The heat sink 240 includes protruding structures 242 such as "fins" or "tines," which increase the surface area for convection and radiation of heat from the heat sink 240 to the surrounding environment. The heat sink, including the protruding structures 242, can be used to mount the assembly 200 to a support member of the vehicle (e.g., vehicle 110). The heat transferred from the ascending convection currents 220 to the heat sink 240 causes cooling of a portion of the liquid coolant that is pooled in the upper manifold 216.

The cooled portion of the liquid coolant becomes less buoyant (e.g., becomes more dense) with respect to yet-uncooled portions of the liquid coolant, so the cooled portions of the liquid coolant are urged downward, which generates descending convection currents 222 (e.g., in response to the heat transferred to the heat sink 240 and in response to continued flow of the ascending convection currents 220). The descending convection currents 222 traverse openings 212a in the lower wall 218 of an upper manifold 216, and are channeled into descending convection channels 224 arranged along the sides of the cavity 214.

The descending convection currents 222 are generally urged downward in response to the general absence of ascending currents in the descending convection channels 224, and in response to buoyancy forces. The sidewalls of the descending convection channels 224 obstruct heated, ascending convection currents 220 with the cavity 214 from entering the descending convection channels 224. A closed convection loop is formed by the cavity 214, the upper manifold 216, the descending convection channels 224, the lower manifold 226 and openings formed therebetween.

The descending convection currents 222 enter the lower manifold 226, so the cooled liquid coolant is pooled in the lower manifold 226. In response to relative pressures generated by the ascending convection currents 220 traversing openings 212a and the descending convection currents 222, the liquid coolant in the lower manifold 226 is urged upwards as (new) ascending convection currents. The openings 212b in the upper wall 228 of the lower manifold 226 are spaced along the upper wall 228 (e.g., across the entire upper wall 228), so that the pooled, cooled liquid coolant in the lower manifold 226 enters the cavity 214 at openings 212b.

The spacing of the openings 212b along the bottom of cavity distributes the entry of the cooled liquid coolant into the cavity 214. The openings 212b can also be arranged close to the face of the transparent portion (e.g., surface) of the cooling chamber 210, which is arranged adjacent to (e.g., in physical contact with) the image-generating panel 230. More particularly, the openings 212b can be arranged to help facilitate entry of greater volumes of coolant directly beneath and adjacent (e.g., subjacent) to the more greatly heated portions (e.g., of the sunlit region 234 and the indirectly sunlight-heated region 232) of the image-generating panel 230. The spacing and size of the openings 212b can be varied to promote greater amounts of heat transfer from the more greatly heated portions of the image-generating panel 230 to the liquid coolant in the cavity 214.

Figure 2B:
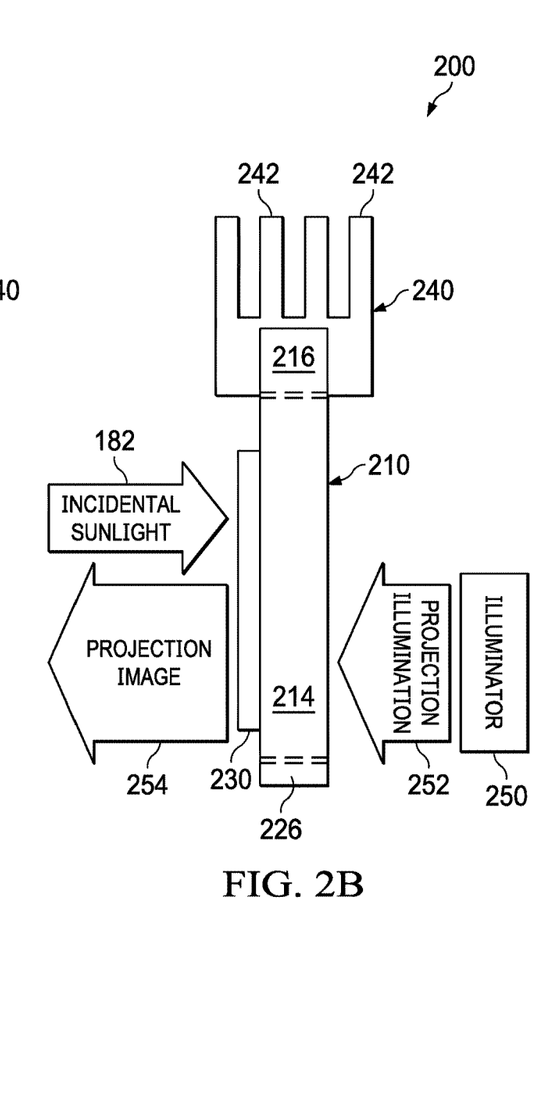
FIG. 2B is a side view of the example liquid-cooled HUD assembly of FIG. 2A.

FIG. 2B is a side view of the example liquid-cooled HUD assembly of FIG. 2A. The transparently cooled image-generating panel assembly 200 of FIG. 2B is a right perspective view of the transparently cooled image-generating panel assembly 200 of FIG. 2A. The transparently cooled image-generating panel assembly 200 generally includes a cooling chamber 210 (e.g., which includes a fluid-filled cavity), an image-generating panel 230 and a heat sink 240. The image-generating panel 230 includes two opposite sides (e.g., surfaces), which are transparent, so the image-generating panel 230 can modulate a projection beam (e.g., projection illumination 252) received on a first side, and project the imaged beam (e.g., as an optical projection image 254) from the opposite side (e.g., second side).

Light entering either or both of the two opposite sides of the image-generating panel 230 can heat delicate structures of the image-generating panel 230, so that the temperatures of the delicate structures can exceed safe operating and/or storage temperatures (e.g., of the image-generating panel 230). Such light entering the image-generating panel 230 can include incidental sunlight 182 and the projection illumination 252 from the illuminator (e.g., light source) 250.

At least one side of the image-generating panel is thermally coupled to (e.g., is adjacent to and/or at least partially surrounded by) the cooling chamber 210, so that the heat absorbed by the image-generating panel 230 can be transferred to the cooling chamber 210. The cooling chamber 210 includes a transparent first side and a transparent second side opposite to the first side, so that the cooling chamber 210 can optically conduct the projection illumination 252 across the image-generating panel 230, and to an adjacent side of the image-generating panel 230.

Generally, the at least one surface of the cooling chamber 210 (which receives heat transferred from the image-generating panel 230) is cooled by a transparent liquid coolant. The liquid coolant is transparent so that, for example, a projection beam (e.g., an imaged projection beam and/or a projection beam for illuminating an imager) can pass through the liquid coolant for projection upon a HUD screen (e.g., windshield).

Figure 3A:
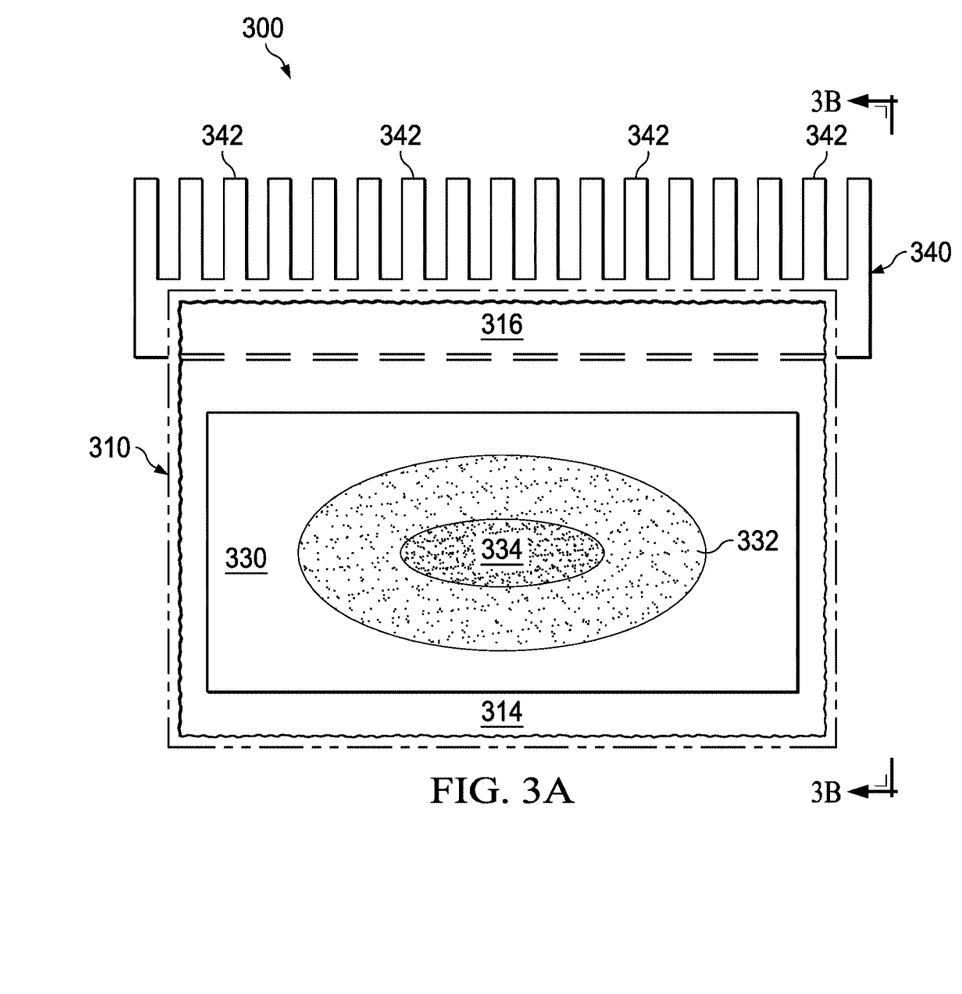
FIG. 3A is a front view of an example phase-change fluid-cooled HUD assembly.

FIG. 3A is a front view of an example liquid-cooled HUD assembly. The transparently cooled image-generating panel assembly 300 is an image-generating panel assembly such as the transparently cooled image-generating panel 128. Generally, the transparently cooled image-generating panel assembly 300 is cooled by a phase-change coolant (e.g., working fluid) that is capable of changing phase states from liquid to gas (when vaporized by heat), and from gas to liquid (when condensed by cooling). The working fluid can be a coolant such as water, methanol, and ammonia. The phase-change coolants is included within a sealed cavity 314 at a pressure selected for causing (or otherwise allowing) phase state changes between a gas and a liquid in response to a change in temperature of the phase-change coolant. (The cavity 314 can include gasses other than phase-change coolants.) The phase-change coolant is transparent so that, for example, a projection beam (e.g., an imaged projection beam and/or a projection beam for illuminating an imager) for projecting an image can pass through the phase-change coolant.

The transparently cooled image-generating panel assembly 300 generally includes a cooling chamber 310, an image-generating panel 330 and a heat sink 340. As shown in FIG. 1, incident sunlight 182 can enter the optics of the HUD assembly 120 when the optical path of the HUD assembly 120 is in solar alignment with the sun 180. In FIG. 3, the incidental sunlight 182 induces localized heating (e.g., in sunlit region 334), which can damage the directly illuminated image-generating elements of the image-generating panel 330. Moreover, the heat absorbed by the sunlit region 334 can dissipate in a laterally outward direction in the image-generating panel 330, so adjacent areas (e.g., indirectly sunlight-heated region 332) in the image-generating panel 330 are indirectly heated in response to the incident sunlight. The indirectly heated image-generating elements of the image-generating panel 330 can also be damaged by the solar-induced heat.

The transparently cooled image-generating panel assembly 300 is generally oriented vertically (e.g., less than around 45 degrees from vertical), so that convection of a phase-change coolant in the cooling chamber 330 is induced. The image-generating panel 330 is thermally coupled to the cooling chamber 310. The cooling chamber 310 is a phase-change coolant-filled cavity for promoting, for example, the transfer of heat from the image-generating panel 330 to the cooling chamber 310. The image-generating panel 330 (which can be a TFT-based LCD panel) can be thermally coupled to the cooling chamber 310 by affixing the image-generating panel 330 to a transparent portion (e.g., surface) of the cooling chamber 310 by interposing a high-temperature transparent adhesive therebetween.

An optically active portion (e.g., for modulation pixels of a displayed image) of the image-generating panel 330 is affixed to a transparent (e.g., in front view) surface of the cooling chamber 310. The cooling chamber 310 includes a cavity 314, which is adjacent to the optically active portion of the image-generating panel 330. The central portion of cavity 314 is free from opaque internal structures that might otherwise noticeably block the passage of light or otherwise obscure the projection beam. The transparent surface of the cooling chamber 310 includes a heat-receiving portion (e.g., a vaporizer) arranged adjacent to (e.g., thermally coupled to) the optically active portion of the image-generating panel. Heat resident in the image-generating panel 330 is transferred to the transparent surface of the cooling chamber 310, and the heat transferred to the transparent surface of the cooling chamber 310 increases the temperature of a portion of a liquid-phase coolant 322 filling the cavity 314.

The heated portion of the liquid-phase coolant 322 causes the heated portion to undergo a phase state change into a gas state (e.g., vapor). The gas-phase coolant 320 is vaporized in the cavity 314, so the gas-phase coolant 320 diffuses into a distal portion 316 (condenser) of the cavity 314. The diffusion of the gas-phase coolant 320 transfers heat to sidewalls (shown in FIG. 3B) of the cavity distal portion 316. The sidewalls of the cavity distal portion 316 thermally couple heat from the sidewalls of the cavity distal portion 316 to the heat sink 340. (Both the heat sink 340 and the cavity distal portion 316 can be opaque because, for example, the heat sink 340 and the cavity distal portion 316 are not arranged in an optical path of the projection beam.)

The heat sink 340 includes protruding structures 342 such as "fins" or "tines," which increase the surface area for radiation of heat from the heat sink 340 to the surrounding environment. The heat sink, including the protruding structures 342, can be used to mount the assembly 300 to a support member of the vehicle for including the assembly 300. The heat transferred from the heated (e.g., ascending) convection currents of the gas-phase coolant 320 to the heat sink 340 causes cooling of a portion of the gas-phase coolant 320 within the cavity distal portion 316.

The cooled portion of the gas-phase coolant 320 condenses into a liquid state (e.g., condensate). The gas-phase coolant 320 condenses into a liquid-phase coolant 322 on an inner surface 312 (shown in FIG. 3B), which can include a coarse surface (e.g., a wick structure). The coarse inner surface 312 of the cavity distal portion 316 includes an irregular surface for promoting fluid transfer from higher concentrations to lower concentrations (e.g., from the condenser to the evaporator) via surface tension and capillary action. The irregular surface can be formed by a texturing the interior surface with grooves and/or by roughening the surface (e.g., with an abrasive). The fluid transfer of the condensate can also be promoted in a downward direction toward a lower portion of cavity 314 by gravity when the cooling chamber 310 includes a vertical orientation (e.g., having a non-zero slope for inducing movement in response to gravity) of the inner surface 312.

Heat transferred from the image-generating panel 330 to the interior surface 312 of the cavity 314 can be further transferred to the liquid-phase coolant 322. The heat is transferred from the interior surface 312 to the liquid-phase coolant 322 while portions of the liquid-phase coolant 322 are removed from the cavity distal portion 316 via capillary action promoted by the coarse interior surface 312. The liquid-phase coolant 322 is converted (e.g., undergoes a phase state change) into a gas-phase coolant, so the gas-phase coolant 322 can diffuse into the as described hereinabove. The phase state conversions are two-way conversions, which complete a coolant loop (e.g., phase-change coolant cycle).

Figure 3B:
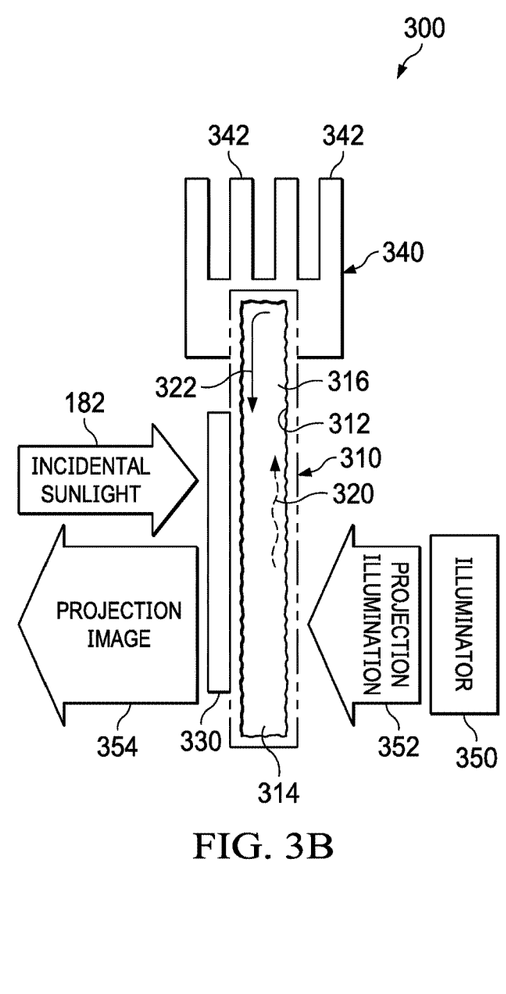
FIG. 3B is a side view of the example phase-change fluid-cooled HUD assembly of FIG. 3A.

FIG. 3B is a side view of the example liquid-cooled HUD assembly of FIG. 3A. The transparently cooled image-generating panel assembly 300 of FIG. 3B is a right perspective view of the transparently cooled image-generating panel assembly 300 of FIG. 3A. The image-generating panel assembly 300 includes a cooling chamber 310, an image-generating panel 330 and a heat sink 340. The image-generating panel 330 includes two opposite sides (e.g., surfaces), which are transparent, so the image-generating panel 330 can image a projection beam (e.g., projection illumination 352) received on a first side, and project the imaged beam (e.g., as projection image 354) from the opposite side (e.g., second side).

Light entering either or both of the two opposite sides of the image-generating panel 330 can heat delicate structures of the image-generating panel 330, which can exceed safe operating and/or storage temperatures of the image-generating panel 330. Such light entering the image-generating panel 330 can include incidental sunlight 182 and the projection illumination 352 from the illuminator (e.g., light source) 350.

At least one side of the image-generating panel is thermally coupled to (e.g., is adjacent to and/or at least partially surrounded by) the cooling chamber 310, so heat absorbed by the image-generating panel 330 can be transferred to the cooling chamber 310. The cooling chamber 310 includes a cavity having at least one rough interior surface 312. The cooling chamber 310 includes a transparent first side and a transparent second side opposite to the first side, so the cooling chamber 310 can optically conduct the projection illumination 352 to an adjacent side of the image-generating panel 330.

Generally, the at least one surface of the cooling chamber 310 (which receives heat transferred from the image-generating panel 330) is cooled by a liquid-phase coolant 322 (e.g., such as ammonia). The liquid-phase coolant 322 is transparent so that, for example, a projection beam (e.g., an imaged projection beam and/or a projection beam for illuminating an imager) can pass through the liquid-phase coolant 322 for projection upon a HUD screen (e.g., windshield).

Figure 4:
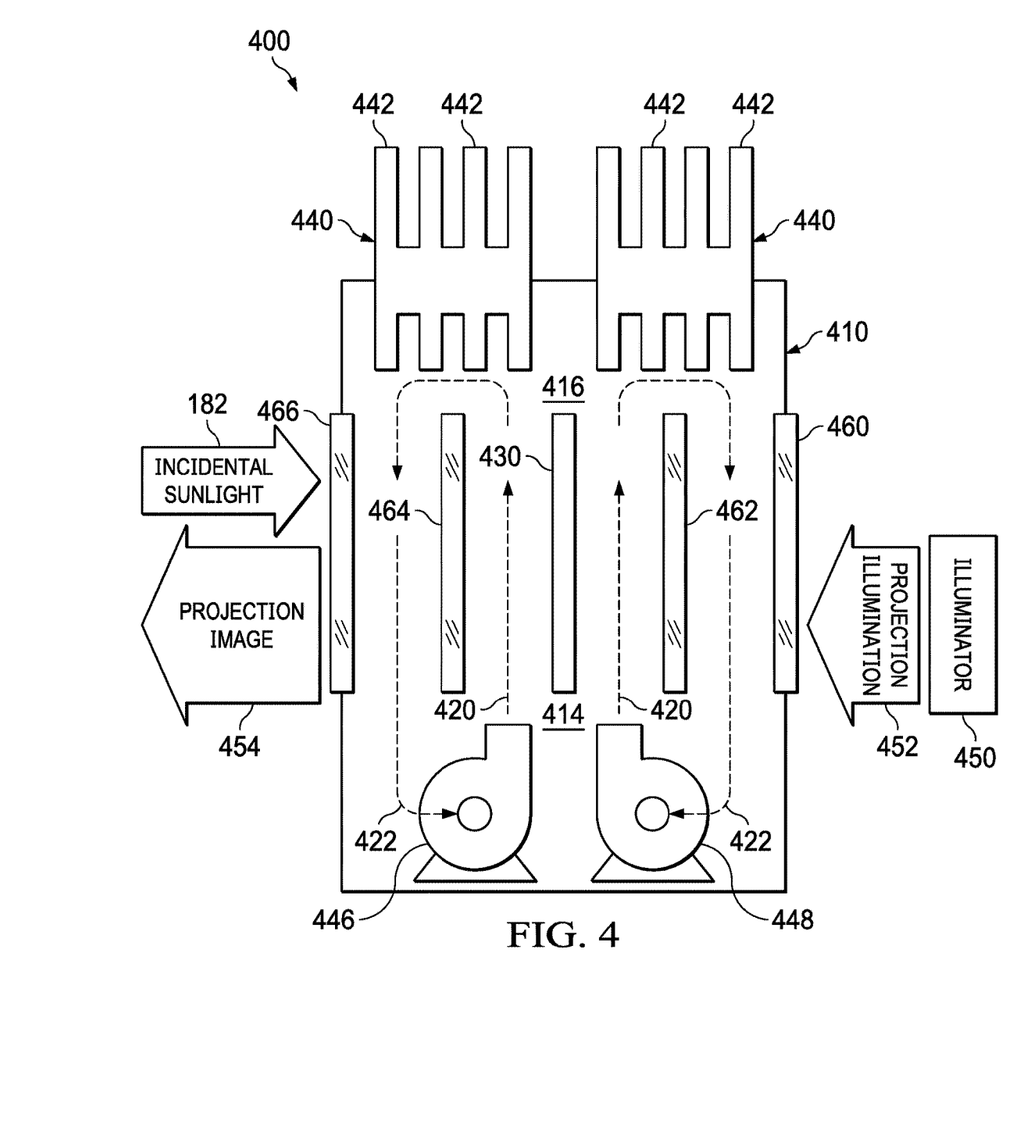
FIG. 4 is a side view of an example air-cooled HUD assembly.

FIG. 4 is a side view of an example air-cooled HUD assembly. The transparently cooled image-generating panel assembly 400 generally includes a cooling chamber 410, an image-generating panel 430 and a heat sink 440. The image-generating panel assembly 400 is an image-generating panel assembly such as the transparently cooled image-generating panel 128.

Generally, the image-generating panel assembly 400 is cooled by an air coolant. The coolant 420 can be air that is forced upward by powered blowers 446 and 448 and/or natural convection. The coolant 422 can be return air, which (e.g., after transferring heat to the at least one heat sink 440) is forced to return (e.g., descend) in response to forces related to the heated (e.g., ascending) coolant 420.

The coolants 420 and 422 can be air (e.g., gasses at selected concentrations and/or gasses at atmospheric concentrations and pressures) included within a sealed cavity 414. The heated coolant 420 can be propelled by at least one blower of 446 and 448 (e.g., where a blower can be a fan, centrifugal blower, piezoelectric-driven membrane and/or any combination thereof). The blower 446 can be included for promoting airflow of the heated coolant 420 between an internal window 462 and a first side of the image-generating panel 430, and the blower 448 can be included for promoting a heated coolant 420 flow between an internal window 464 and a second side (e.g., opposite the first side) of the image-generating panel 430. The internal windows 462 and 464 are arranged parallel to first and second sides (e.g., left and right sides) of the image-generating panel 430. The coolant 420 and the windows 460, 462, 464 and 466 are transparent so that, for example, a projection beam (e.g., an imaged projection beam and/or a projection beam for illuminating an imager) for projecting an image can pass through the coolant within the sealed cavity 414.

As shown in FIG. 1, incidental sunlight 182 can enter the optics of the HUD assembly 120 when the optical path of the HUD assembly 120 is in solar alignment with the sun 180. In FIG. 4, the incidental sunlight 182 induces localized heating, which can damage and/or degrade the directly illuminated image-generating elements of the image-generating panel 430. Additional heating is absorbed during operation in response to the projection illumination 452 (e.g., generated by an illuminator 450). The additional heating can reduce the tolerance margins of the image-generating panel assembly 400 with respect to the incident sunlight 182 both during and after operation (for example, after operation, the image-generating panel assembly 400 retains heat previously absorbed from the projection illumination 452).

The transparently cooled image-generating panel assembly 400 is optionally oriented vertically (e.g., less than around 45 degrees from vertical), so that convection (e.g., natural, unpowered convection) of a coolant in the cooling chamber 430 can be induced when power is not applied to at least one of the blowers 446. The blowers 446 and 448 can be configured to provide (e.g., provide as a default configuration) a channel for convection air currents in the absence of operating power.

The image-generating panel 430 is thermally coupled to the cooling chamber 410, for example, by inclusion of a portion of the image-generating panel 430 within the cooling chamber 410. The included portion can be the entire optically active portion of the image-generating panel (e.g., including the TFT-based liquid crystals for modulating a projection beam such as projection illumination 452). The transparent surface of the cooling chamber 410 includes a heat-receiving portion arranged adjacent to (e.g., thermally coupled to) the optically active portion of the image-generating panel. In the example shown in FIG. 4, both first and second sides of the image-generating panel 430 are surrounded by the coolant 420; the combined surface area of the first and second sides of the image-generating panel 430 includes a majority of the surface area of the image-generating panel 430, which promotes efficient cooling of the image-generating panel 430.

The cooling chamber 410 includes a cavity 414, which is adjacent to the optically active portion of the image-generating panel 430. A central portion of cavity 414 is free from opaque internal structure that might otherwise noticeably block the passage of light or otherwise obscure portions of the projection beam (e.g., the projection illumination 452 and/or the projection image 454).

The cooling chamber 410 includes at least one of an illuminator-side cooling loop and a screen-side (e.g., a side downstream of the image-generating panel 430) cooling loop. The illuminator-side cooling loop include surfaces of an interior window 462, an exterior window 460, a first side (e.g., right side) of the image-generating panel 430, and the blower 448. For example, the blower 448 can force the coolant 420 (e.g., as forced air) through a cooling channel arranged between the first side of the image-generating panel 430 and the interior window 462. As the coolant 420 traverses the area in the cooling channel adjacent to the first side of the image-generating panel 430, the coolant 420 absorbs heat radiated by the image-generating panel 430. When the heated coolant 420 engages surfaces of (and/or adjacent to) a portion of the heat sink 440, heat carried by the heated coolant 420 is transferred to a portion (e.g., interior portion) of the heat sink 440 to be radiated to the surrounding ambient air adjacent to the protruding structure 442 of the heat sink 440. After heat is removed from the coolant 420, the cooled coolant 420 is channeled (e.g., as forced return air) through a return channel arranged between the interior window 462 and the exterior window 460. The cooled coolant 422 exits the return channel and enters an intake of the blower 448, which completes the illuminator-side cooling loop.

The screen-side cooling loop include surfaces of an interior window 464, an exterior window 466, a second side (e.g., left side) opposite to the first side of the image-generating panel 430, and the blower 446. For example, the blower 446 can force the coolant 420 (e.g., as forced cooling air) through a cooling channel arranged between the first side of the image-generating panel 430 and the interior window 464. As the coolant 420 is forced past the area in the cooling channel adjacent to the first side of the image-generating panel 430, the coolant 420 absorbs heat radiated by the image-generating panel 430. When the heated coolant 420 engages surfaces of (and/or adjacent to) a portion of the heat sink 440, heat carried by the coolant 420 is transferred to a portion (e.g., interior portion) of the heat sink 440 for being radiated to the exterior of the cooling chamber 410. After heat is removed from the coolant 420, the cooled coolant 420 is channeled (e.g., as forced return air) through a return channel arranged between the interior window 464 and the exterior window 466. The returned coolant 422 exits the return channel and enters an intake of the blower 446, which completes the screen-side cooling loop.

The heated portions of the coolant 420 cause the heated portions to become more buoyant. The heated portions of the coolant 420 are more buoyant with respect to unheated portions of the coolant in the cavity 414, so the heated portions of the coolant 420 are urged by their relative buoyancies to ascend into a distal portion 416 of the cavity 414. The heated convection currents of the coolant 420 transfer heat to portions of the heat sink 440, which includes protruding structures 442 in a distal portion 416 of the cavity 414. The coolant 420 currents of the distal portion 416 thermally couple heat received from the imaging panel 430 to the heat sink 440. (Both the heat sink 440 and structures of the distal portion 416 can be opaque because, for example, the heat sink 440 and the distal portion are not arranged in an optical path of the projection beam.)

The heat sink 440 includes protruding structures 442 such as "fins" or "tines," which increase the surface area for radiation of heat from the heat sink 440 to the surrounding environment. The heat sink, including the protruding structures 442, can be used to mount the assembly 400 to a support member of the vehicle for including the assembly 400. The heat transferred from the heated convection currents 420 to the heat sink 440 causes cooling of a portion of the coolant 420 within the upper cavity 416.

In another example, a single blower (such as blower 446) can be arranged to force cooling air into two cooling channels arranged along respective sides (e.g., the first and second sides) of the image-generating panel 430. The exhaust air of the blower can be divided into the respective channels, so that the first and second sides of the imaging panel 416 can both be cooled by exhaust air from a single blower. The return channels can be coupled to the air intake of the blower.

Figure 5A:
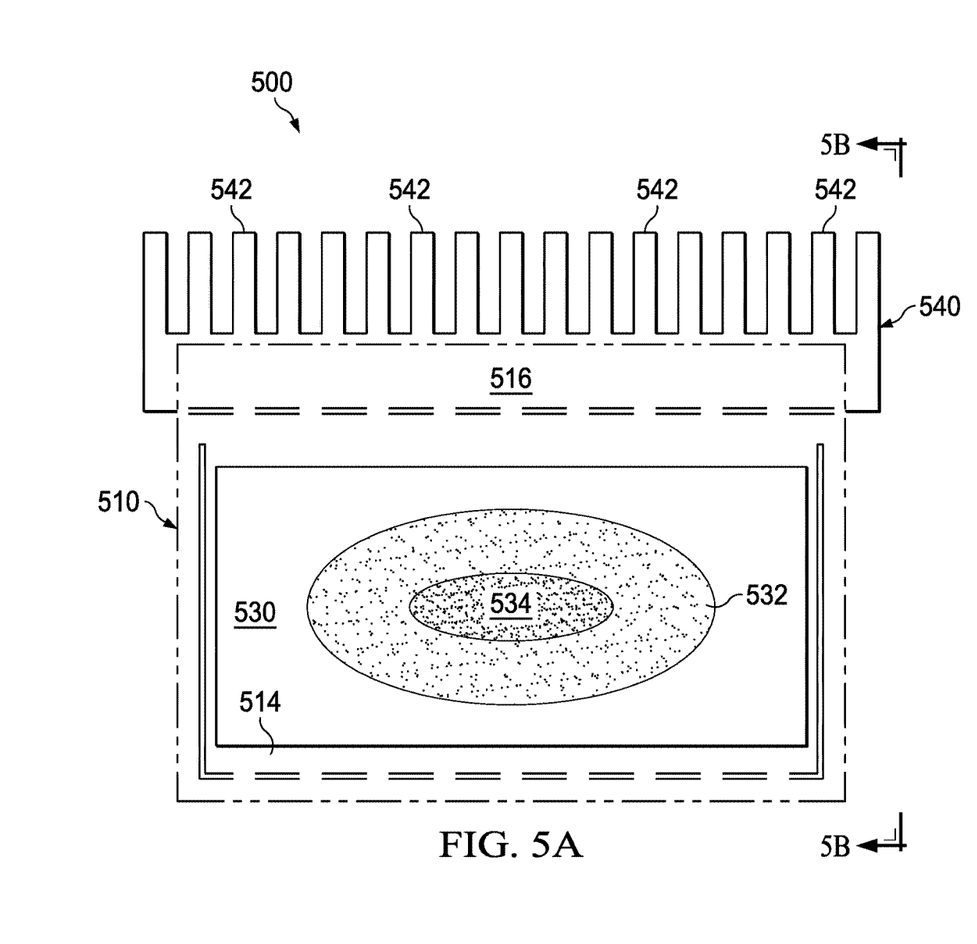
FIG. 5A is a front view of an example thermally conductive panel-cooled HUD assembly.

FIG. 5A is a front view of an example thermally conductive panel-cooled HUD assembly. The transparently cooled image-generating panel assembly 500 is an image-generating panel assembly such as the transparently cooled image-generating panel 128.

The transparently cooled image-generating panel assembly 500 generally includes a cooling panel 510, an image-generating panel 530 and a heat sink 540. As shown in FIG. 1, incident sunlight 182 can enter the optics of the HUD assembly 120 when the optical path of the HUD assembly 120 is in solar alignment with the sun 180. In FIG. 5, the incident sunlight 182 induces localized heating (e.g., in the sunlit region 534), which can damage the directly illuminated image-generating elements of the image-generating panel 530. Moreover, the heat absorbed by the sunlit region 534 can dissipate in a laterally outward direction in the image-generating panel 530, so adjacent areas (e.g., indirectly sunlight-heated region 532) in the image-generating panel 530 are indirectly heated in response to the incident sunlight. The indirectly heated image-generating elements of the image-generating panel 530 can also be damaged by the solar-induced heat.

The transparently cooled image-generating panel assembly 500 can be arranged in any suitable orientation. The image-generating panel 530 is thermally coupled to the cooling panel 510. The cooling panel 510 is a solid, thermally conductive panel for promoting, for example, the transfer of heat from the image-generating panel 530 to the cooling panel 510. The image-generating panel 530 (which can be a TFT-based LCD panel) can be thermally coupled to the cooling panel 510 by affixing the image-generating panel 530 to a transparent portion (e.g., surface) of the cooling panel 510 by interposing a high-temperature transparent adhesive therebetween.

An optically active portion (e.g., for modulation pixels of a displayed image) of the image-generating panel 530 is affixed to a transparent (e.g., in front view) surface of the cooling panel 510. The cooling panel 510 can include transparent, thermally conductive materials such as silicon carbide, gallium nitride, sapphire and/or diamond. Each of the thermally conductive materials can be arranged in a transparent form (e.g., crystalline form) for transmitting a projection beam from a first side of the cooling panel to a second side opposite the first side.

The cooling panel cools the image-generating panel 530 by transferring heat (e.g., via entropy) to the heat sink 540 for dissipation of heat to the environment. The cooling panel 510 is free from opaque internal structures that might otherwise noticeably block the passage of light or otherwise obscure the projection beam. Heat resident in the image-generating panel 530 is transferred to the transparent surface of the cooling panel 510. The transparent surface of the cooling panel includes a heat-receiving portion arranged adjacent to (e.g., thermally coupled to) the optically active portion of the image-generating panel. For example, the arrangement of the thermally conductive materials in the cooling panel facilitates transfer of heat from the sunlit region 534 and the indirectly sunlight-heated region 532 to more distal portions of the cooling panel 510 (such as regions 514 and 516).

The region 516 is arranged adjacent (e.g., connected or otherwise thermally coupled) to the heat sink 540. Both the region 540 and the upper cavity 516 can be opaque because, for example, the heat sink 540 and the region 516 are not arranged in an optical path of the projection beam.

The heat sink 540 includes protruding structures 542 such as "fins" or "tines," which increase the surface area for radiation of heat from the heat sink 540 to the surrounding environment. The heat sink, including the protruding structures 542, can be used to mount the assembly 500 to a support member of the vehicle for including the assembly 500.

Figure 5B:
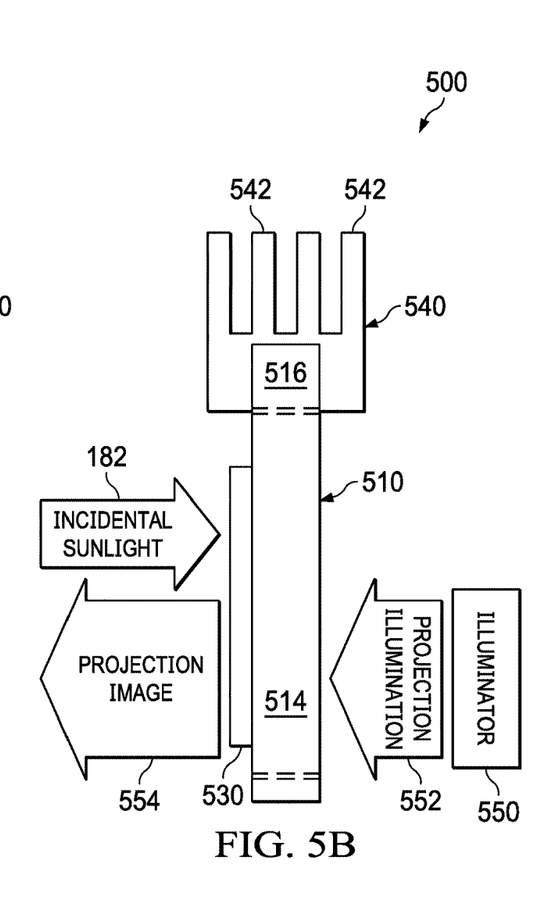
FIG. 5B is a side view of the example thermally conductive panel-cooled HUD assembly of FIG. 5A.

FIG. 5B is a side view of the example thermally conductive panel-cooled HUD assembly of FIG. 5A. The transparently cooled image-generating panel assembly 500 of FIG. 5B is a right perspective view of the transparently cooled image-generating panel assembly 500 of FIG. 5A. The transparently cooled image-generating panel assembly 500 generally includes a cooling panel 510, an image-generating panel 530 and a heat sink 540. The image-generating panel 530 includes two opposite sides (e.g., surfaces), which are transparent, so the image-generating panel 530 can image a projection beam (e.g., projection illumination 552) received on a first side, and project the imaged beam (e.g., as projection image 554) from the opposite side (e.g., second side).

Light entering either or both of the two opposite sides of the image-generating panel 530 can heat delicate structures of the image-generating panel 530, which can exceed safe operating and/or storage temperatures of the image-generating panel 530. Such light entering the image-generating panel 530 can include incidental sunlight 182 and the projection illumination 552 from the illuminator (e.g., light source) 550.

At least one side of the image-generating panel is thermally coupled to (e.g., is adjacent to and/or at least partially surrounded by) the cooling panel 510, so heat absorbed by the image-generating panel 530 can be transferred to the cooling panel 510. The cooling panel 510 includes a transparent first side and a transparent second side opposite to the first side, so the cooling panel 510 can optically conduct the projection illumination 552 to an adjacent side of the image-generating panel 530.

Generally, the cooling panel 510 is transparent (e.g., having an internal transparency of greater than 95 percent for a 1 mm thickness throughout the spectral range of 420 through 680 nm), thermally conductive (e.g., at rates greater than around 25 Watts per meter Kelvin). The cooling panel can be arranged adjacent to an LCD-based HUD display panel in any suitable orientation. Such arrangements facilitate a compact arrangement of components in a HUD system that are protected against damage from heat generated by incident solar radiation. The compact arrangement can be used to increase reliability and reduce costs, complexity and space requirements of a HUD assembly.

Modifications are possible in the described embodiments, and other embodiments are possible, within the scope of the claims.

What is claimed is:

1. An apparatus comprising:
    a heat sink;
    an image-generating panel configured to project an image by modulating a light beam; and
    a cooling device having first and second sides, the second side having a heat-receiving portion thermally coupled to the image-generating panel, the cooling device configured to transmit the light beam from the first side through the heat-receiving portion to the image-generating panel, and the cooling device including a cooling loop thermally coupled between the heat-receiving portion and the heat sink, the cooling loop configured to circulate a phase-change coolant whose phase state changes from liquid into gas responsive to heat received by the phase-change coolant from the image-generating panel and that changes from gas into liquid responsive to heat transferred from the phase-change coolant to the heat sink;
    in which the cooling loop includes a coarse interior surface configured to promote a capillary action flow of the phase-change coolant whose phase state is liquid.

2. The apparatus of claim 1, wherein the image-generating panel has first and second sides and is configured to selectively transmit the light beam from the first side through the image-generating panel to the second side.

3. The apparatus of claim 1, wherein the image-generating panel is configured to generate heat responsive to incident sunlight, and the cooling device is configured to transfer a portion of the generated heat to the heat sink.

4. The apparatus of claim 1, wherein the second side of the cooling device is opposite the first side of the cooling device.

5. An apparatus comprising:
    a vehicle;
    a heat sink mounted on the vehicle;
    an image-generating panel mounted on the vehicle, the image-generating panel having a panel input, and the image-generating panel configured to project an image by modulating a light beam responsive to modulation signals at the panel input; and
    a cooling device mounted on the vehicle, the cooling device having first and second sides, the second side having a heat-receiving portion thermally coupled to the image-generating panel, the cooling device configured to transmit the light beam from the first side through the heat-receiving portion to the image-generating panel, and the cooling device including a cooling path thermally coupled between the heat-receiving portion and the heat sink;
    a windshield mounted on the vehicle;
    an illuminator configured to generate the light beam;
    a processor coupled to the panel input, the processor configured to provide the modulation signals to the panel input; and
    optics configured to focus the projected image onto the windshield, the focused projected image including vehicle navigation information.

6. The apparatus of claim 5, wherein the cooling path is configured to transfer heat from the heat-receiving portion to the heat sink.

7. The apparatus of claim 5, wherein the second side of the cooling device is opposite the first side of the cooling device.

8. The apparatus of claim 5, wherein the image-generating panel has first and second sides and is configured to selectively transmit the light beam from the first side through the image-generating panel to the second side.

9. The apparatus of claim 5, wherein the image-generating panel is configured to generate heat responsive to incident sunlight, and the cooling device is configured to transfer a portion of the generated heat to the heat sink.

10. An apparatus comprising:
a heat sink;
an image-generating panel configured to project an image by modulating a light beam; and
a cooling device having first and second sides, the second side having a heat-receiving portion thermally coupled to the image-generating panel, the cooling device configured to transmit the light beam from the first side through the heat-receiving portion to the image-generating panel, and the cooling device including a cooling loop thermally coupled between the heat-receiving portion and the heat sink, the cooling loop configured to circulate a phase-change coolant whose phase state changes from liquid into gas responsive to heat received by the phase-change coolant from the image-generating panel and that changes from gas into liquid responsive to heat transferred from the phase-change coolant to the heat sink;
in which a portion of the cooling loop is configured to receive a heated current of the phase-change coolant whose phase state is gas, transfer heat from the heated current to the heat sink, and generate a cooled current of the phase-change coolant whose phase state is liquid responsive thereto.

11. An apparatus comprising:
a heat sink;
an image-generating panel configured to project an image by modulating a light beam; and
a cooling device having first and second sides, the second side having a heat-receiving portion thermally coupled to the image-generating panel, the cooling device configured to transmit the light beam from the first side through the heat-receiving portion to the image-generating panel, and the cooling device including a cooling loop thermally coupled between the heat-receiving portion and the heat sink, the cooling loop configured to circulate a phase-change coolant whose phase state changes from liquid into gas responsive to heat received by the phase-change coolant from the image-generating panel and that changes from gas into liquid responsive to heat transferred from the phase-change coolant to the heat sink;
in which a portion of the cooling loop is configured to receive a current of the phase-change coolant, and distribute the received current across the portion of the cooling loop.

* * * * *